(12) United States Patent
Otsuka et al.

(10) Patent No.: US 10,622,067 B2
(45) Date of Patent: Apr. 14, 2020

(54) MEMORY SYSTEMS AND MEMORY WRITING METHODS

(71) Applicant: Micron Technology, Inc., Boise, ID (US)

(72) Inventors: Wataru Otsuka, Boise, ID (US);
Takafumi Kunihiro, Boise, ID (US);
Tomohito Tsushima, Boise, ID (US);
Makoto Kitagawa, Folsom, CA (US);
Jun Sumino, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 16/189,387

(22) Filed: Nov. 13, 2018

(65) Prior Publication Data

US 2019/0080759 A1 Mar. 14, 2019

Related U.S. Application Data

(60) Division of application No. 15/162,420, filed on May 23, 2016, now Pat. No. 10,438,661, which is a continuation of application No. 13/914,415, filed on Jun. 10, 2013, now Pat. No. 9,349,450.

(51) Int. Cl.
*G11C 13/00* (2006.01)
*H01L 27/10* (2006.01)

(52) U.S. Cl.
CPC ...... *G11C 13/0097* (2013.01); *G11C 13/0002* (2013.01); *G11C 13/0011* (2013.01); *G11C 13/0023* (2013.01); *G11C 13/0028* (2013.01); *G11C 13/0061* (2013.01); *G11C 13/0069* (2013.01); *G11C 2013/0071* (2013.01); *G11C 2013/0085* (2013.01); *G11C 2013/0088* (2013.01); *G11C 2213/79* (2013.01); *G11C 2213/82* (2013.01); *H01L 27/101* (2013.01)

(58) Field of Classification Search
CPC ............ G11C 13/0002; G11C 13/0011; G11C 13/0069; G11C 11/5614
USPC .................................................. 365/148, 51
See application file for complete search history.

(56) References Cited

U.S. PATENT DOCUMENTS

| | | | |
|---|---|---|---|
| 6,778,421 B2 | 8/2004 | Tran | |
| 6,879,508 B2 | 4/2005 | Tran | |
| 7,110,295 B2 | 9/2006 | Ishikawa et al. | |
| 7,233,526 B2 | 6/2007 | Umezawa | |

(Continued)

OTHER PUBLICATIONS

CN CN 1902599 Abst/Full Ref., Jan. 24, 2007, Sandisk Corp.

(Continued)

*Primary Examiner* — Alfredo Bermudez Lozada
(74) *Attorney, Agent, or Firm* — Wells St. John P.S.

(57) ABSTRACT

Memory devices and memory operational methods are described. One example memory system includes a common conductor and a plurality of memory cells coupled with the common conductor. The memory system additionally includes access circuitry configured to provide different ones of the memory cells into one of a plurality of different memory states at a plurality of different moments in time between first and second moments in time. The access circuitry is further configured to maintain the common conductor at a voltage potential, which corresponds to the one memory state, between the first and second moments in time to provide the memory cells into the one memory state.

15 Claims, 14 Drawing Sheets

(56) References Cited

U.S. PATENT DOCUMENTS

| | | |
|---|---|---|
| 7,345,908 B2 | 3/2008 | Hachino et al. |
| 7,409,489 B2 | 8/2008 | Sinclair |
| 7,450,420 B2 | 11/2008 | Sinclair et al. |
| 7,552,271 B2 | 6/2009 | Sinclair et al. |
| 7,558,905 B2 | 7/2009 | Sinclair et al. |
| 7,558,906 B2 | 7/2009 | Sinclair et al. |
| 7,562,181 B2 | 7/2009 | Sinclair et al. |
| 7,581,057 B2 | 8/2009 | Sinclair et al. |
| 7,590,794 B2 | 9/2009 | Sinclair et al. |
| 7,590,795 B2 | 9/2009 | Sinclair et al. |
| 7,610,437 B2 | 10/2009 | Sinclair et al. |
| 7,669,003 B2 | 2/2010 | Sinclair et al. |
| 7,732,800 B2 | 6/2010 | Lai et al. |
| 7,876,598 B2 | 1/2011 | Schroegmeier et al. |
| 7,949,845 B2 | 5/2011 | Sinclair et al. |
| 7,984,084 B2 | 7/2011 | Sinclair |
| 8,055,832 B2 | 11/2011 | Sinclair et al. |
| 8,068,365 B2 | 11/2011 | Kim |
| 8,080,440 B2 | 12/2011 | Lai et al. |
| 8,102,695 B2 | 1/2012 | Ono et al. |
| 8,107,273 B1 | 1/2012 | Hollmer et al. |
| 8,117,380 B2 | 2/2012 | Conley et al. |
| 8,120,990 B2 | 2/2012 | Kim |
| 8,291,151 B2 | 10/2012 | Sinclair |
| 8,369,132 B1 | 2/2013 | Hollmer et al. |
| 8,379,450 B2 | 2/2013 | Kim |
| 8,504,798 B2 | 8/2013 | Conley et al. |
| 8,559,209 B2 | 10/2013 | Siau |
| 8,619,493 B2 | 12/2013 | Kim |
| 8,625,331 B1 | 1/2014 | Hollmer et al. |
| 8,675,408 B2 | 3/2014 | Kim |
| 8,737,151 B2 | 5/2014 | Bateman et al. |
| 8,745,322 B2 | 6/2014 | Conley et al. |
| 9,042,156 B2 | 5/2015 | Nakura et al. |
| 9,117,527 B2 | 8/2015 | Kim |
| 9,330,765 B2 | 5/2016 | Kim |
| 9,349,450 B2 | 5/2016 | Otsuka et al. |
| 10,438,661 B2 | 10/2019 | Otsuka et al. |
| 2003/0174530 A1 | 9/2003 | Tran |
| 2004/0090809 A1 | 5/2004 | Tran |
| 2005/0128815 A1 | 6/2005 | Ishikawa et al. |
| 2005/0144358 A1 | 6/2005 | Conley et al. |
| 2006/0083072 A1 | 4/2006 | Umezawa |
| 2006/0203430 A1 | 9/2006 | Pinnow et al. |
| 2007/0012959 A1* | 1/2007 | Hachino ............ G11C 13/0007 257/260 |
| 2007/0030734 A1 | 2/2007 | Sinclair et al. |
| 2007/0033324 A1 | 2/2007 | Sinclair |
| 2007/0033325 A1 | 2/2007 | Sinclair |
| 2007/0033326 A1 | 2/2007 | Sinclair |
| 2007/0033327 A1 | 2/2007 | Sinclair |
| 2007/0033328 A1 | 2/2007 | Sinclair et al. |
| 2007/0033329 A1 | 2/2007 | Sinclair et al. |
| 2007/0033330 A1 | 2/2007 | Sinclair et al. |
| 2007/0033331 A1 | 2/2007 | Sinclair et al. |
| 2007/0033332 A1 | 2/2007 | Sinclair et al. |
| 2007/0033374 A1 | 2/2007 | Sinclair et al. |
| 2007/0033375 A1 | 2/2007 | Sinclair et al. |
| 2007/0033376 A1 | 2/2007 | Sinclair et al. |
| 2007/0033377 A1 | 2/2007 | Sinclair et al. |
| 2007/0033378 A1 | 2/2007 | Sinclair et al. |
| 2007/0186032 A1 | 8/2007 | Sinclair et al. |
| 2007/0278529 A1 | 12/2007 | Lai et al. |
| 2008/0304339 A1 | 12/2008 | Dietrich et al. |
| 2009/0196102 A1 | 8/2009 | Kim |
| 2009/0196103 A1 | 8/2009 | Kim |
| 2009/0216938 A1 | 8/2009 | Conley et al. |
| 2009/0219756 A1 | 9/2009 | Schroegmeier et al. |
| 2009/0273961 A1 | 11/2009 | Ono et al. |
| 2010/0027318 A1* | 2/2010 | Nagashima ........ G11C 13/0004 365/148 |
| 2010/0080060 A1 | 4/2010 | Chen et al. |
| 2010/0091548 A1 | 4/2010 | Reed et al. |
| 2010/0207095 A1 | 8/2010 | Lai et al. |
| 2010/0246239 A1 | 9/2010 | Lee et al. |
| 2011/0242875 A1* | 10/2011 | Nagashima ........ G11C 13/0004 365/148 |
| 2012/0033497 A1 | 2/2012 | Kim |
| 2012/0075914 A1 | 3/2012 | Bateman et al. |
| 2012/0092921 A1 | 4/2012 | Ono et al. |
| 2012/0113721 A1 | 5/2012 | Kim |
| 2012/0314477 A1 | 12/2012 | Siau |
| 2013/0088911 A1 | 4/2013 | Nakura et al. |
| 2013/0128668 A1 | 5/2013 | Kim |
| 2013/0242641 A1 | 9/2013 | Nakai |
| 2013/0339585 A1 | 12/2013 | Conley et al. |
| 2014/0133235 A1 | 5/2014 | Kim |
| 2014/0140122 A1 | 5/2014 | Siau |
| 2014/0362633 A1 | 12/2014 | Otsuka et al. |
| 2016/0005469 A1 | 1/2016 | Kim |
| 2016/0267978 A1 | 9/2016 | Otsuka et al. |
| 2019/0318782 A1 | 10/2019 | Otsuka et al. |

OTHER PUBLICATIONS

CN CN 201480032109.9 SR Trans., dated Mar. 17, 2017, Micron Technology, Inc.
EP EP 14811475.4 Supp Search Rept, dated Jan. 16, 2017, Micron Technology, Inc.
JP JP 2003-331585 Abst/Full Ref, Nov. 21, 2003, Toshiba Corp.
JP JP 2005-175070 Abst/Full Ref, Jun. 30, 2005, Renesas Technology Corp.
JP JP 2006-114125 Abst/Full Ref., Apr. 27, 2006, Toshiba Corp.
JP JP 2006-222420 Full w/Trans, Aug. 24, 2006, Infineon Technologies AG.
JP JP 2009-271985 Abst/Full Ref, Nov. 19, 2009, Hitachi Ltd.
JP JP 2009-503735 Abst/Full Ref., Jan. 29, 2009, Sandisk Corp.
JP JP 2011-233181 Abst/Ful Ref, Nov. 17, 2011, Nihon Spansion Ltd.
JP JP 2011-511391 Abst/Full Ref, Apr. 7, 2011, Mosaid Technologies Inc.
JP JP 2013-084324 Abst/Full Ref, May 9, 2013, Sharp Corp. et al.
JP JP 2016-518065 OA Translation, dated Dec. 13, 2016, Micron Technology, Inc.
JP JP 2016-518065 OA w/Trans, dated May 23, 2017, Micron Technology, Inc.
KR KR10-2003-0074423 Abs/Full Ref, Sep. 19, 2003, Hewlett-Packard Company.
WO PCT/US2014/041591 IPRP, dated Dec. 15, 2015, Micron Technology, Inc.
WO PCT/US2014/041591 Search Rept., dated Oct. 23, 2014, Micron Technology, Inc.
WO PCT/US2014/041591 Writ. Opin., dated Oct. 23, 2014, Micron Technology, Inc.
TW TW 103118300 SR Trans., dated Oct. 18, 2015, Micron Technology, Inc.
Otsuka et al., U.S. Appl. No. 16/453,772, filed Jun. 26, 2019, titled "Memory Devices and Memory Operational Methods", 47 pages.

* cited by examiner

_US 10,622,067 B2_

MEMORY SYSTEMS AND MEMORY WRITING METHODS

RELATED PATENT DATA

This application is a divisional of and claims priority to U.S. patent application Ser. No. 15/162,420, which was filed May 23, 2016, and which is a continuation of and claims priority to U.S. patent application Ser. No. 13/914,415, which was filed Jun. 10, 2013, now U.S. Pat. No. 9,349,450, the teachings of which are incorporated herein by reference.

TECHNICAL FIELD

At least some embodiments disclosed herein pertain to memory devices and memory operational methods.

BACKGROUND OF THE DISCLOSURE

Memory devices are widely used in electronic devices, such as digital cameras and personal audio players, for storing digital data. Many different types of memory are available, each using a different fundamental technology for storing data, and the memory may be volatile or non-volatile memory. Resistive random-access memory (RRAM), conductive-bridge random-access memory (CBRAM) and flash are examples of non-volatile memory.

At least some embodiments described below are directed towards memory devices and memory operational methods. Some of the disclosed embodiments provide reduced power consumption compared with other memory arrangements.

DETAILED DESCRIPTION OF THE DISCLOSURE

Figure 1:
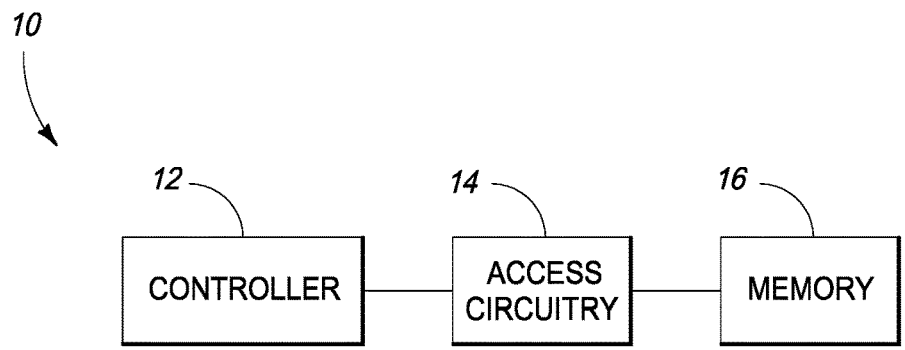
FIG. 1 is a functional block diagram of a memory system according to one embodiment.

Referring to FIG. 1, a functional block diagram of a memory system 10 is shown according to one embodiment. The illustrated memory system 10 includes a controller 12, access circuitry 14, and memory 16. Memory system 10 may be implemented within or with respect to various associated devices (not shown), such as computers, cameras, media players, and thumb drives, in some examples. Memory system 10 stores data generated or utilized by the associated devices in the described examples. Other embodiments of memory system 10 are possible and may include more, less and/or alternative components or circuitry.

Controller 12 controls operations of writing, reading and re-writing data of memory 16 as well as interfacing with other components or circuitry, such as sources of data to be stored within memory 16. Controller 12 may access and process commands with respect to memory 16 during operations of an associated device. Example commands instruct the generation of program (reset) and erase (set) voltage potentials which are applied to memory 16 in one embodiment. The program and erase operations are used to write data to memory (i.e., program the memory) and are both referred to as write operations in one embodiment. Controller 12 may also control the application of read and verify pulses to memory 16 to read and verify stored data in one embodiment.

In one embodiment, controller 12 is configured to process data, control data access and storage, issue commands, and control other desired operations. Controller 12 may comprise processing circuitry configured to execute programming provided by appropriate computer-readable storage media (e.g., memory) in at least one embodiment. For example, the controller 12 may be implemented as one or more processor(s) and/or other structure configured to execute executable instructions including, for example, software and/or firmware instructions. Other example embodiments of controller 12 may include hardware logic, PGA, FPGA, ASIC, state machines, and/or other structures alone or in combination with one or more processor(s). These examples of controller 12 are for illustration and other configurations are possible.

Access circuitry 14 is coupled with controller 12 and memory 16 and is configured to implement addressing (selection of columns and rows of memory 16), writing, reading, verifying and re-writing operations with respect to memory cells of memory 16 in one embodiment. For example, access circuitry 14 may receive instructions from controller 12 to select a specific block, page, word or byte of the memory 16 as well as to implement writing, reading, verifying and re-writing with respect to a plurality of cells of the selected block, page, word or byte. As discussed below, the access circuitry 14 may apply electrical voltage potentials to the memory 16 to perform write, read and verification operations in one embodiment.

Memory 16 includes a plurality of memory cells configured to store data, conductors electrically connected with the memory cells, and perhaps additional circuitry, for example circuits of the access circuitry 14. At least some of the memory cells are individually capable of being programmed to a plurality of different memory states at a plurality of moments in time. Memory 16 is accessible to the user and/or associated device for storage of digital information. The memory cells may be configured as non-volatile cells in some implementations and may have different electrical resistances corresponding to different memory states. In one specific example implementation, memory 16 is implemented as conductive bridge random access memory (CBRAM) and the memory cells are conductive bridge memory cells.

Memory 16 may be implemented in different arrangements in different embodiments. For example, the memory 16 may be implemented within a memory device, such as a chip, a portion of the chip (e.g., tiles and/or sub-tiles discussed below) or other arrangements. The memory device may also include controller 12 and/or access circuitry 14 or portions thereof.

Figure 2:
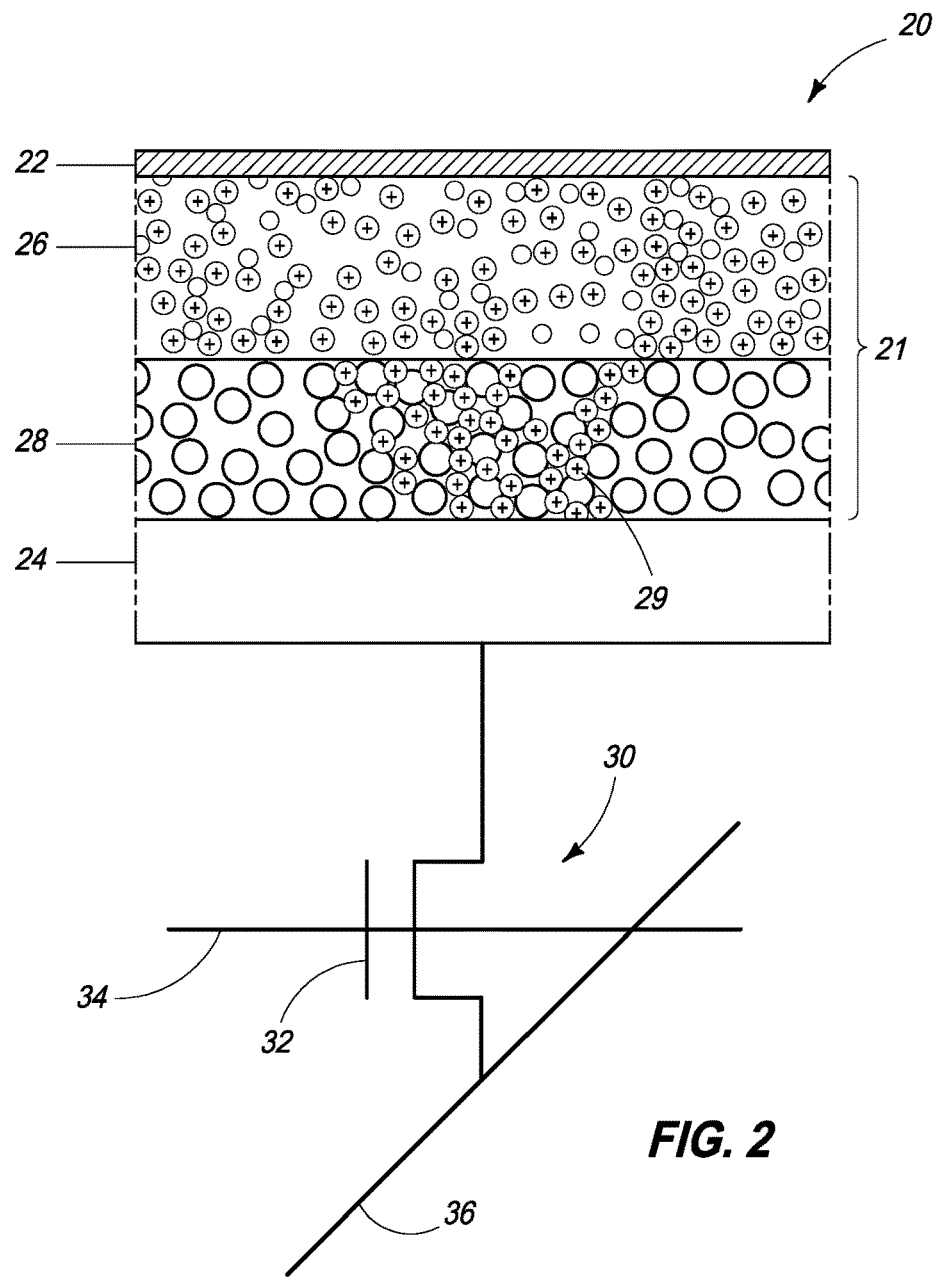
FIG. 2 is an illustrative representation of a memory cell according to one embodiment.

Referring to FIG. 2, an example of a memory cell 20 of memory 16 is shown. The illustrated example memory cell 16 is a one transistor/one resistor (1T1R) CBRAM memory cell. Other types of memory cells may be utilized in other embodiments. The example memory cell 16 includes a top electrode 22, memory element 21 and bottom electrode 24. Top and bottom electrodes 22, 24 comprise electrically conductive material and may also be referred to as first and second electrodes (or vice versa) of the memory cell 20 in one embodiment.

The illustrated embodiment of memory element 21 includes an electrically conductive source member or layer 26 and a dielectric layer 28 intermediate the electrodes 22, 24. In one embodiment, the source layer 26 is a Cu+ source layer (e.g., CuTe), example materials of the dielectric layer 28 include AlOx, HfOx, and ZrOx, and the bottom electrode 24 is titanium nitride (TiN). Other embodiments are possible. Top electrode 22 may be coupled with or part of a conductive common source line or plate as discussed in further detail below.

The memory cell 20 shown in FIG. 2 includes one or more conductive structures 29 (e.g., filaments) in a low resistance state which may correspond to one of a plurality of different memory states (e.g., a "one" or "zero" in an example binary application) of the memory cell 20. The memory cell 20 may also be programmed to a high resistance state where the conductive structures 29 are removed and not present and which may correspond to another of the different memory states. Different write voltage potentials may be applied across top and bottom electrodes 22, 24 to change the resistance (and memory state) of the memory cell 20.

More specifically, an erase/set programming operation may be performed by the application of a voltage potential/bias to the top electrode 22 which is more positive than the voltage potential/bias applied to the bottom electrode 24. The application of these signals causes inducement of Cu ions into dielectric layer 28 and formation of one or more electrically conductive structures 29 (e.g., filaments) through dielectric layer 28 and between conductive source layer 26 and bottom electrode 24. The formation of the structures 29 provides the memory cell 25 in a low resistance state. In one embodiment, the structures 29 comprise material (e.g., copper) from the source layer 26.

A memory cell 20 having the conductive structures 29 may be programmed in a program/reset operation to a high resistance state by the application of a voltage potential/bias to the bottom electrode 24 which is more positive than the voltage potential/bias applied to the top electrode 22. The application of these signals cause Cu ions to return into source layer 26 and dissolves any electrically conductive structures 29 within dielectric layer 28, thereby increasing the electrical resistance of the memory element 21 between the electrodes 22, 24 and providing the memory cell 20 in a high resistance state.

Memory cell 20 being may be repeatedly written between the high and low resistance arrangements at different moments in time to store different data values corresponding to the different memory (e.g., resistive) states. In one embodiment, a current is passed through the memory cell 22 and sense circuitry may measure the current to determine the resistance and memory state of the memory cell 20.

FIG. 2 also illustrates an access transistor 30 (e.g., NMOS) having a gate 32 coupled with a word line 34 and plural terminals coupled with bottom electrode 24 and a bit line 36. Word line 34 is used to select the memory cell 20 for reading/writing and bit line 36 is used to conduct appropriate signals for the reading/writing of the memory cell 20.

Figure 3:
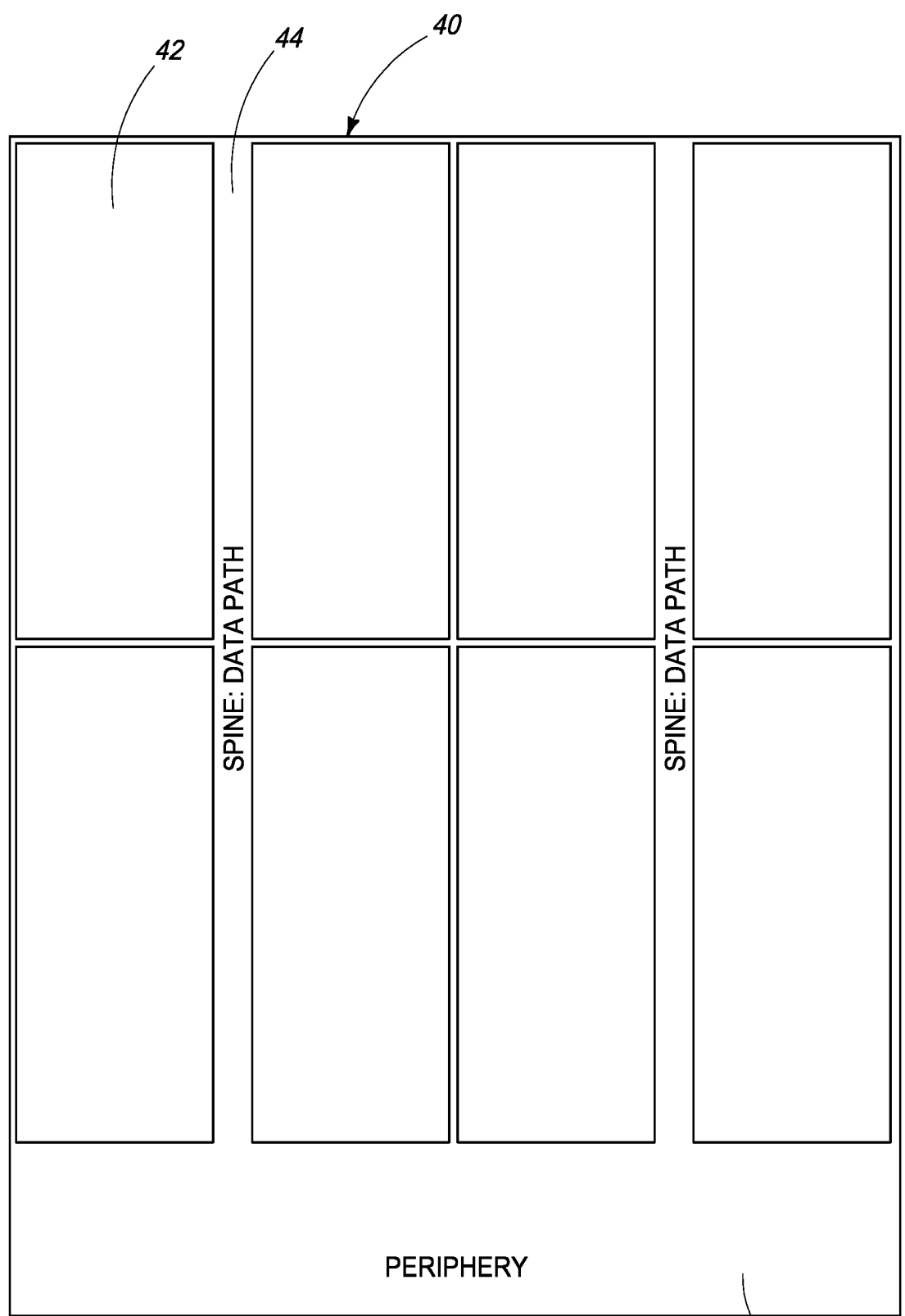
FIG. 3 is an illustrative representation of a memory chip according to one embodiment.

Referring to FIG. 3, an example chip 40 which includes an array of a plurality of memory cells is shown according to one embodiment. The example array of the illustrated chip 40 includes a plurality of banks 42, data buses 44 and a periphery 46 in one embodiment. Banks 42 individually include 2 Gb of memory cells as well as sense circuitry, write circuitry, read/write buffer circuitry, routing circuitry, bank level circuitry and perhaps other circuitry. The example chip 40 includes eight banks 42 providing 16 Gb of memory cells for data storage although other arrangements are possible.

Figure 4:
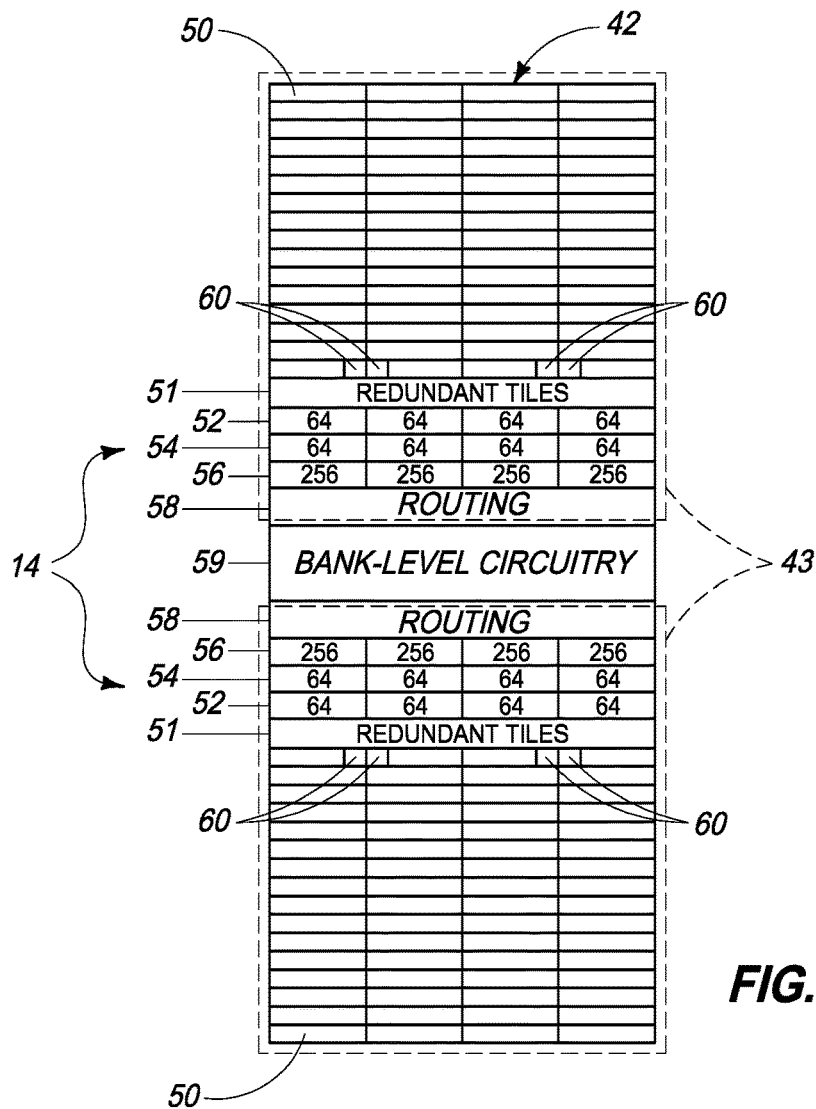
FIG. 4 is an illustrative representation of a bank of a memory chip according to one embodiment.

Referring to FIG. 4, additional details regarding an example configuration of a bank 42 are shown. The illustrated bank 42 has upper and lower portions 43 which each include a plurality of tiles 50. Tiles 50 are arranged in a plurality of rows and columns in one embodiment. In the example illustrated arrangement, thirty-two rows and four columns of the tiles 50 are included in the upper and lower portions 43 of a single bank 42 providing 128 tiles per bank.

Figure 5:
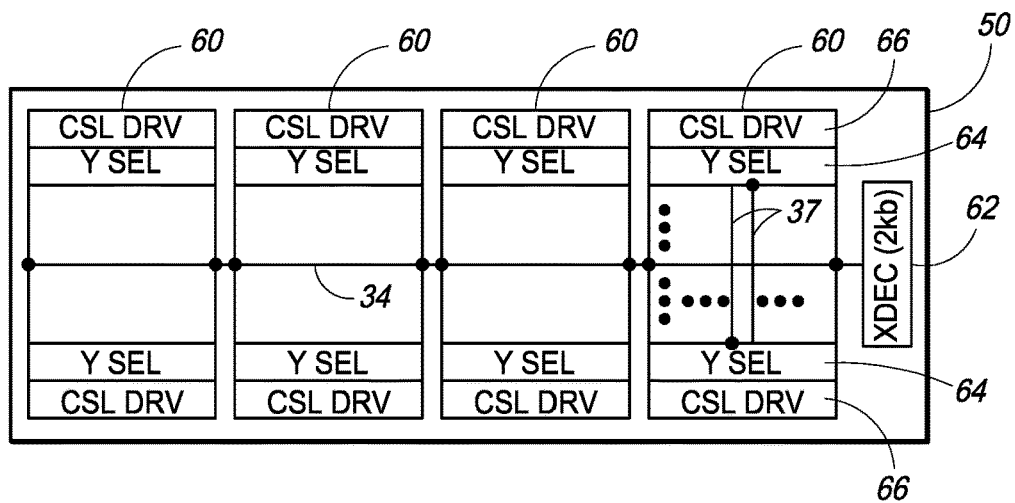
FIG. 5 is an illustrative representation of a tile of a memory chip according to one embodiment.
Figure 6:
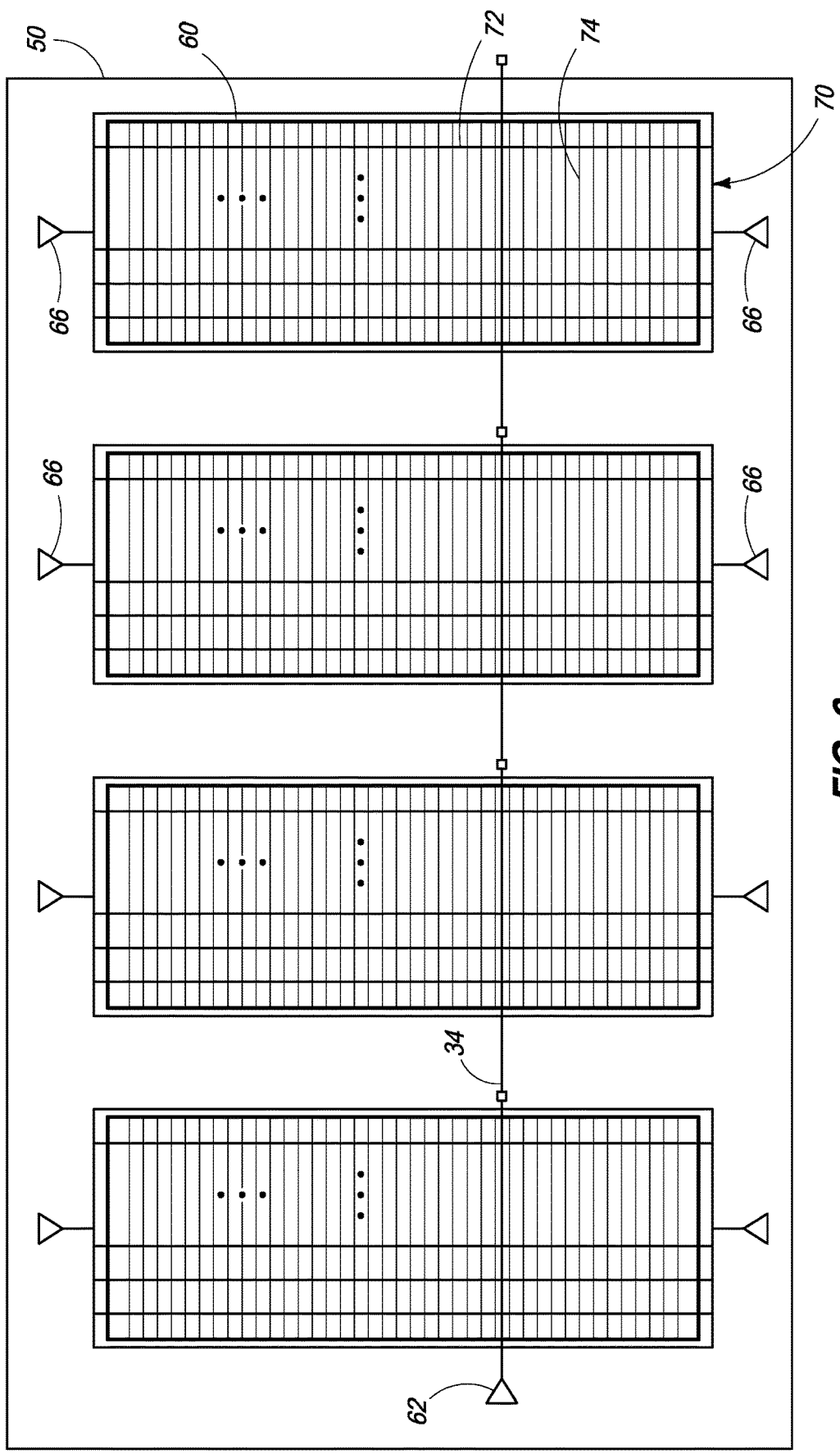
FIG. 6 is an illustrative representation of a tile of a memory chip according to one embodiment.

In one embodiment, the tiles 50 individually include a plurality of sub-tiles 60 which individually include a plurality of memory cells (additional details regarding an example sub-tile 60 are shown in FIGS. 5 and 6). In one more specific example, a tile 50 includes four sub-tiles 60 which individually include 4 Mb of memory cells, providing 16 Mb of memory cells per tile 50 in one embodiment. The illustrated example bank 42 also includes one or more redundant tiles 51 which may be utilized to replace another tile 50 of the bank 42 which has failed in one embodiment.

The illustrated bank 42 additionally includes access circuitry 14 which is configured to write and read data with respect to the memory cells of the tiles 50 of the upper and lower portions of the bank 42. Access circuitry 14 includes upper and lower sense circuits 52 which are configured to read the memory cells of the tiles 50 of the upper and lower portions 43 of the bank 42, respectively. Access circuitry 14 also includes upper and lower program circuits 54 which are configured to write the memory cells of the tiles 50 of the upper and lower portions 43 of the bank 42, respectively. Access circuitry 14 additionally includes upper and lower read/write buffer circuits 56 which are configured to buffer data being accessed from or written to the tiles 50 of the upper and lower portions of the bank 42, respectively.

The sense circuits 52, program circuits 54 and buffer circuits 56 are arranged corresponding to the columns of tiles 50 of the upper and lower portions 43 of bank 42 in the illustrated embodiment. For example, the sense circuit 52, program circuit 54 and buffer circuit 56 of a given column are configured to read or write data with respect to the tiles 50 of the same column and within the respective upper or lower portions 43 of the bank 42 corresponding to the location of the circuitry 52, 54, 56.

In the illustrated example, the sense circuit 52 includes circuitry to simultaneously sense 64 memory cells, the program circuit 54 includes circuitry to simultaneously write 64 memory cells, and buffer circuit 56 includes circuitry to simultaneously store data of 256 memory cells. In one embodiment described in additional detail below, sense circuits 52 and program circuits 54 are coupled with sixty-four global bit lines which enables the circuits 52, 54 to simultaneously read or write sixty-four bits from an individual sub-tile 60.

Bank 42 also includes respective routing circuitry 58 for upper and lower portions 43 of tiles 50. Routing circuitry 58 includes data buses for moving data between the access circuitry 14 and bank-level circuitry 59. In one embodiment, bank-level circuitry 59 may implement operations of controller 12 and may include bank level control logic, a microcontroller, and a write state machine.

In one embodiment, a page size which may be used for writing operations (erase or program) is 256 B. In one example, a plurality of sub-tiles 60 may be accessed to implement a page operation. As discussed above, sense circuits 52 and program circuits 54 are capable of reading/writing with respect to sixty-four bits of a sub-tile 60 in the described example. In one embodiment, eight sub-tiles 60 may be simultaneously read from/written to (e.g., the eight sub-tiles 60 shown in FIG. 4) by the respective sense circuits 52 or program circuits 54 to implement a read or write command with respect to the memory cells of the selected sub-tiles 60. Execution of four read or write operations with respect to the eight sub-tiles 60 implements a page operation of 256 B in this described example. In addition, the data may be buffered using the respective buffer circuits 56 during the four operations in one embodiment. This example page size and method of accessing a page is in accordance with one possible embodiment and other embodiments are possible.

In some embodiments, the memory cells of a single sub-tile 60 are coupled with a common conductor which may be referred to as a common source line or plate. For example, 4 Mb of memory cells of a sub-tile 60 may be coupled with the common conductor. The common conductor may be charged and discharged during a single erase operation of memory cells. However, the charging/discharging of the common conductor during the erase operation consumes a relatively significant amount of power (e.g., 55% of the power to implement operation) due to the capacitance of the common conductor resulting from numerous memory cells coupled with the common conductor (e.g., a capacitance of approximately 400 pF for 4 Mb of memory cells).

In one embodiment, a single common write/erase operation is performed upon a block of memory cells which is larger in size than a page. More specifically, all of the memory cells of a sub-tile 60 are erased during one charge/discharge cycle of the common conductor of the sub-tile 60. This reduces the number of charge/discharge cycles which are performed to erase the memory cells of the sub-tile 60 compared with erasing pages individually using plural charge/discharge cycles of the common conductor.

In one embodiment, the memory cells of a plurality of sub-tiles 60 of a plurality of different tiles 50 (e.g., the eight sub-tiles 60 of eight tiles 50 within upper and lower portions 43 of different columns shown in FIG. 4) are simultaneously erased during a single common write operation in the form of a block erase write operation. All of the memory cells of the selected sub-tiles 60 are erased during the single block erase write operation providing erasure of a block size of 4 MB (e.g., eight sub-tiles 60 each having 4 Mb memory cells) in one embodiment. The common conductors of the eight sub-tiles 60 are each only charged/discharged once during this example single block erase write operation which provides improved power efficiency compared with implementing plural erase operations upon individual pages of 256 B memory cells.

Referring to FIG. 5, additional details of an example tile 50 are shown in one embodiment. The illustrated example tile 50 includes four sub-tiles 60 which individually include 4 Mb of memory cells providing an individual tile 50 with 16 Mb of memory cells. Furthermore, an individual tile 50 includes access circuitry 14 including an x decoder 62 in the illustrated embodiment. Individual sub-tiles 60 include access circuitry 14 including y decoders 64 and common source line drivers 66 in the illustrated embodiment. X decoder 62 is coupled with a plurality of word lines 34 and Y decoders 64 are coupled with a plurality of bit line controls 37 in the example arrangement. For example, tile 50 may include 2 k word lines 34 and an individual sub-tile 60 may include 2 k bit lines and bit line controls 37 (each y decoder 64 addresses 1 kb of memory cells in one embodiment). Bit line controls 37 are fabricated from M0 metallization and word lines 34 are strapped and fabricated from M1 metallization in one embodiment. Common source line drivers 66 are coupled with a plurality of CSL straps shown in FIG. 6.

Referring to FIG. 6, details regarding one embodiment of a common conductor 70 discussed above are shown. The common conductor 70 may also be referred to as a plate or common source line. The common conductor 70 of a given sub-tile 60 is configured as a vertically segmented CSL plate which is driven from top and bottom using plural drivers 66 and has a capacitance of approximately 400 pF in one embodiment.

The common conductor 70 is configured to provide a common voltage bias to the memory cells of the respective sub-tile 60. In the described embodiment, common conductor 70 includes a plurality of straps 72 to reduce the resistance of the common conductor 70 and which extend vertically across a sub-tile 60 of memory cells (e.g., thirty-two straps 72 are provided spaced apart by 64 bits in one embodiment). The straps 72 are coupled with a plurality of source lines 74 which extend horizontally across a sub-tile 60 of memory cells (e.g., 2 kb source lines 74 are provided in one embodiment). Common conductor 70 is coupled with top electrodes 22 of the memory cells 20 shown in FIG. 2 and which are within the respective sub-tile 60.

Figure 7:
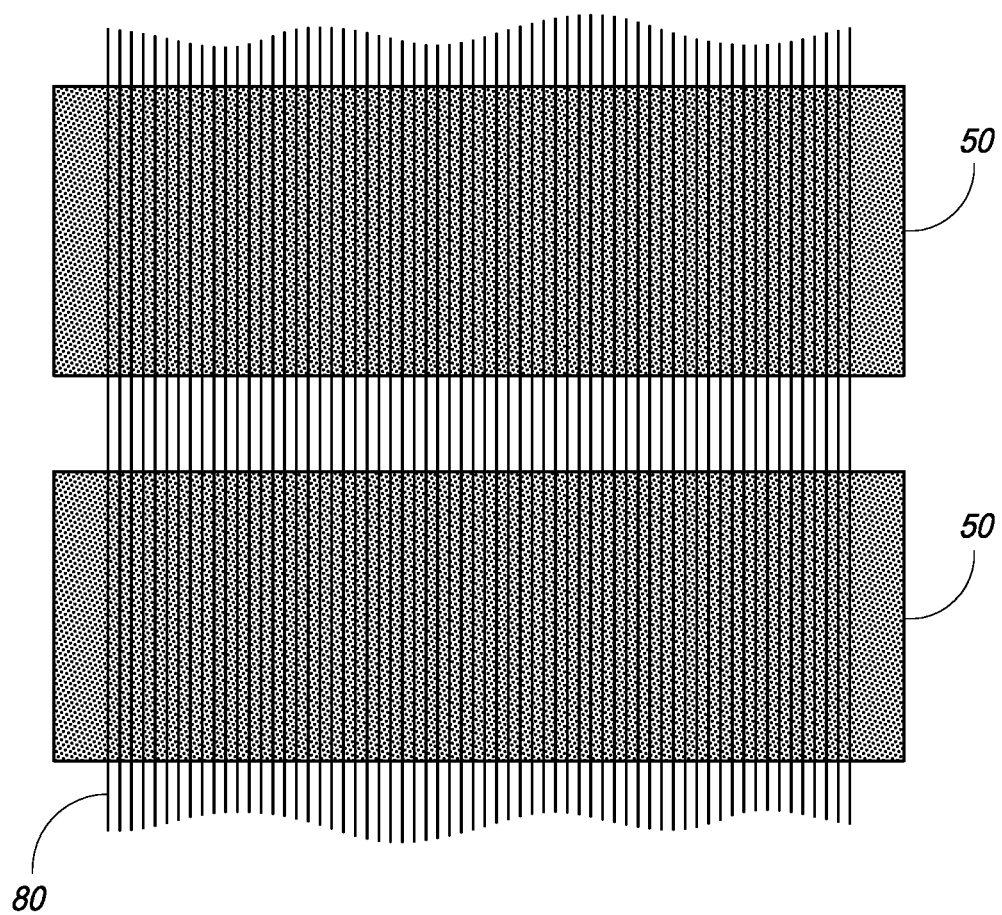
FIG. 7 is an illustrative representation of a plurality of tiles and global bit lines of a memory chip according to one embodiment.

Referring to FIG. 7, a plurality of example sub-tiles 60 of a column of sub-tiles 60 within an upper or lower portion 43 of a bank 42 are shown coupled with a plurality of global bit lines 80. The global bit lines 80 are coupled with access circuitry 14 (not shown) of the respective upper or lower portion 43 of bank 42 and extend vertically across all sub-tiles 60 of the respective column of the upper or lower portion 43 of bank 42.

Figure 8:
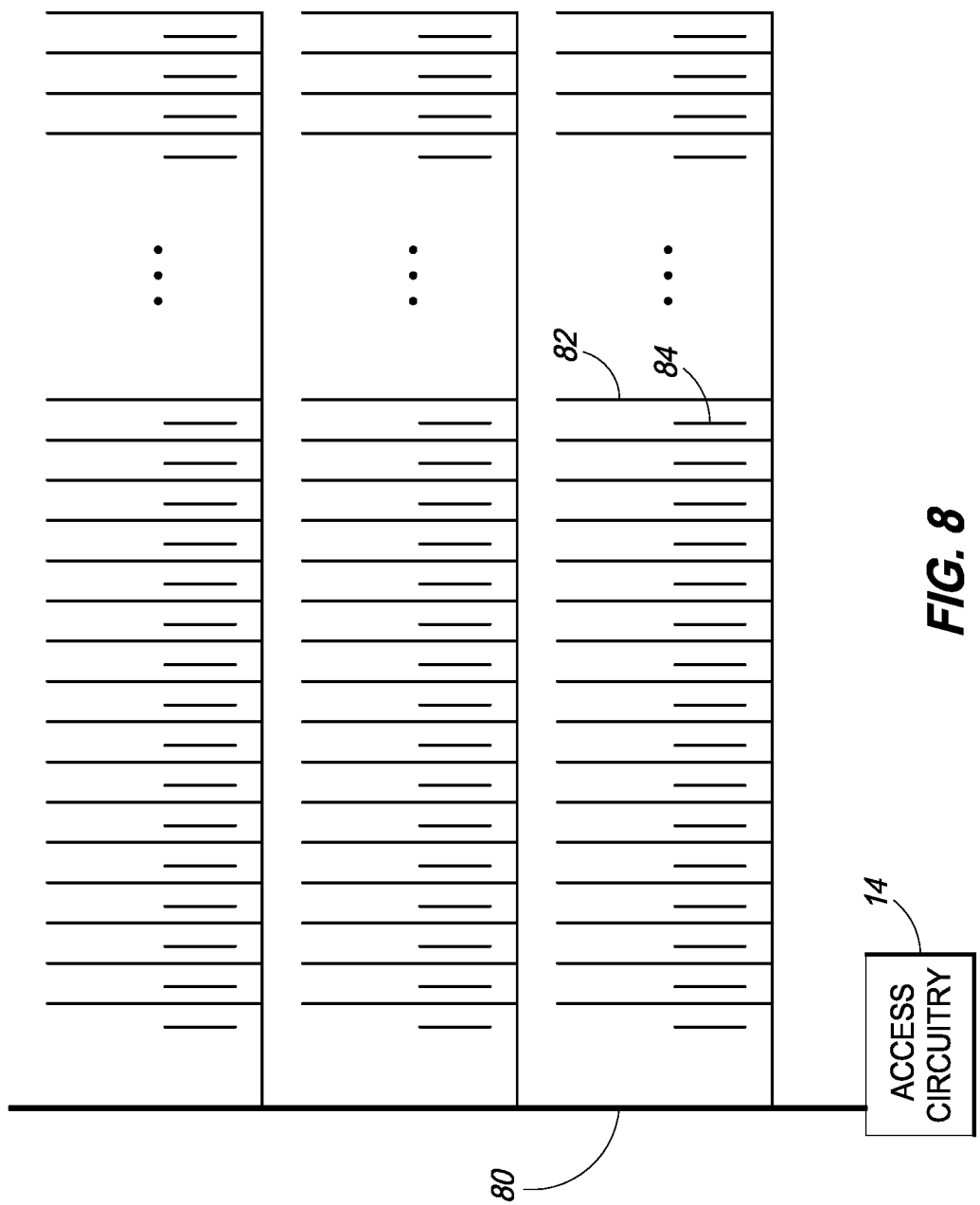
FIG. 8 is an illustrative representation of a plurality of global and local bit lines of a memory chip according to one embodiment.

Referring to FIG. 8, access circuitry 14 is shown in an example embodiment coupled with a global bit line 80 which is coupled with a plurality of bit lines 82, which may be referred to as local bit lines and correspond to bit lines 36 shown in FIG. 2. In one embodiment, an individual column of sub-tiles 60 of an upper or lower portion 43 of bank 42 has sixty-four global bit lines 80 and an individual global bit line 80 is coupled with thirty-two local bit lines 82. An individual global bit line 80 may be fabricated from M2 metallization and is coupled with a respective I/O sense amplifier of access circuitry 14 in one embodiment. Furthermore, a plurality of select transistors 84 selectively couple respective local bit lines 82 with global bit line 80 via control from bit line controls 37 (controls 37 are shown in FIG. 5).

Figure 9:
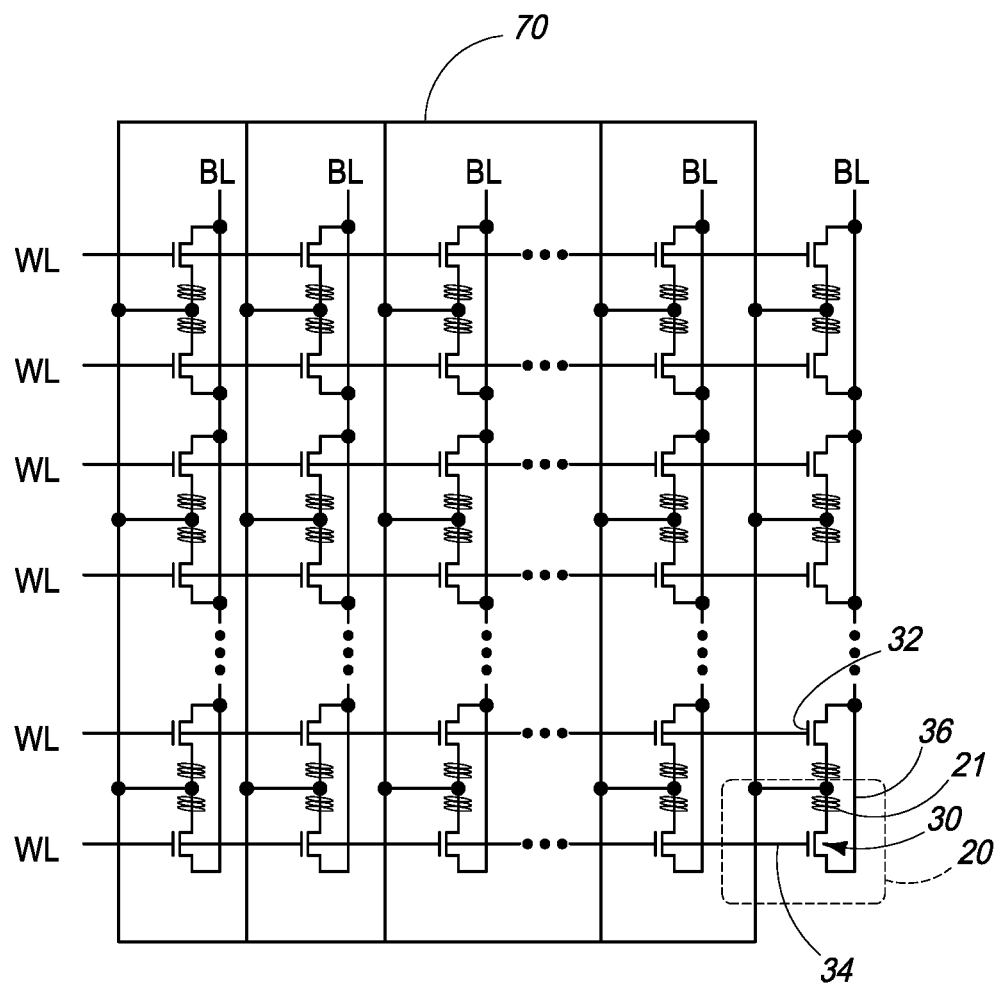
FIG. 9 is an electrical schematic representation of a portion of a sub-tile of a memory chip according to one embodiment.

Referring to FIG. 9, illustrative electrical connections of a plurality of memory cells 20 of a portion of a memory array are shown in one embodiment. The depicted portion of the memory array resides within one of the sub-tiles 60 wherein the memory cells 20 are individually coupled with the common conductor (e.g. common source line) 70 in one embodiment. In the depicted example, a memory element 21 of a memory cell 20 is coupled with access transistor 30 and common conductor 70. The gate 32 of transistor 30 is coupled with a word line 34. The bit lines 36 are selectively coupled with the memory elements 21 of the memory cells 20 as a result of control from the word lines 34. Memory cells 20 may be provided in different arrangements in different embodiments.

In one example embodiment, a set write instruction may be applied to a selected memory cell 20 by applying a high voltage bias to the common conductor 70 and unselected bit lines 36 and a selected word line 34 while providing a low voltage bias to the selected bit line 36 and unselected word lines 34. In this example embodiment, a reset write instruction may be applied to a selected memory cell 20 by applying a low voltage bias to the common conductor 70, unselected word lines 34 and unselected bit lines 36 while providing a high voltage bias to the selected bit line 36 and selected word line 34.

Figure 10:
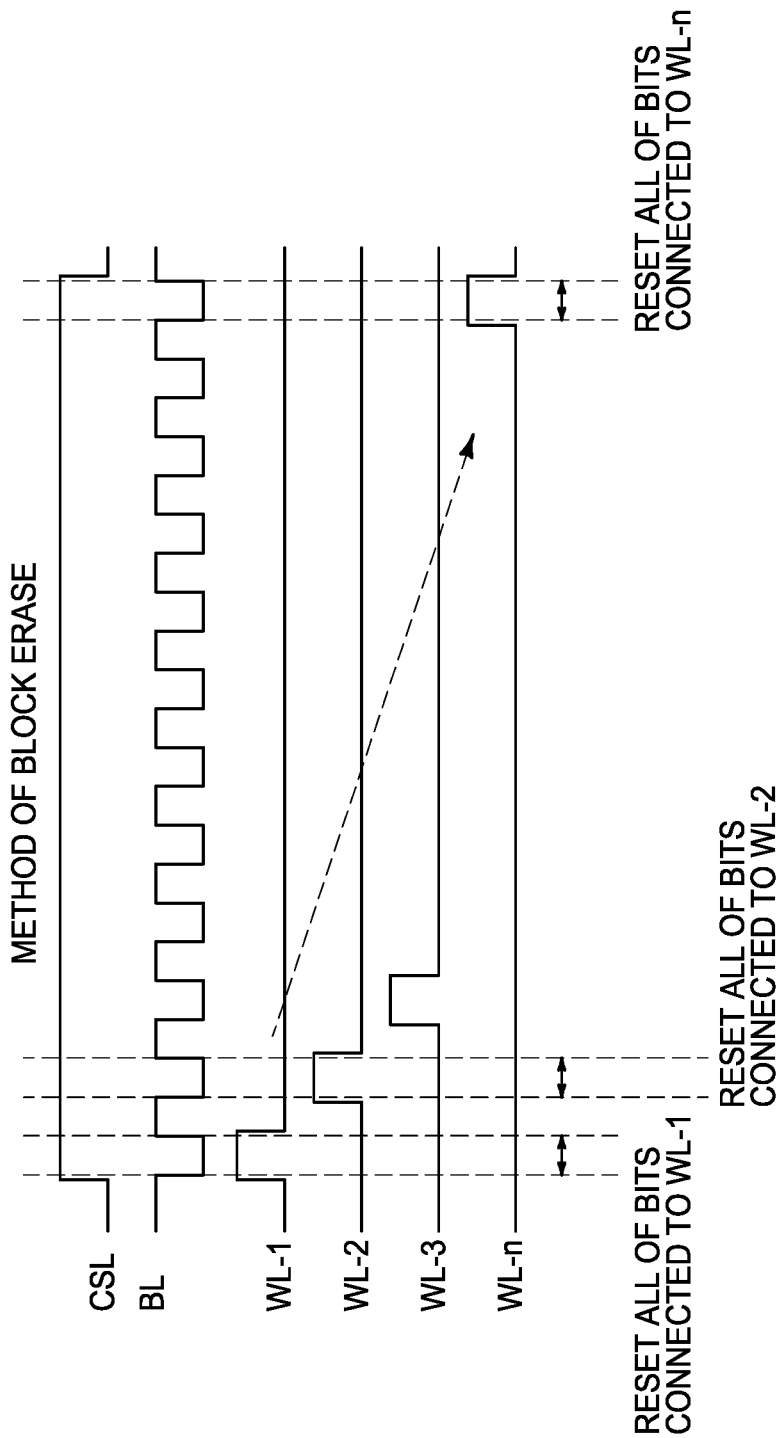
FIG. 10 is a timing diagram of signals used to implement a block erase write operation according to one embodiment.

Referring to FIG. 10, voltage biases of a plurality of signals provided to memory cells of a sub-tile 60 for implementing a block erase write operation according to one embodiment are shown. A high voltage bias is applied to the common conductor (e.g., CSL) during the implementation of the block erase write operation. The bit lines coupled with the memory cells are toggled between high and low voltage biases while individual word lines are selectively asserted (e.g., having a high voltage bias in one example) in order from WL-1 to WL-n. All of the memory cells coupled with word line WL-1 are erased/set during a low voltage bias upon the bit lines of the memory cells while the respective word line WL-1 is held at a high voltage bias. The remaining word lines receive the high voltage bias in order and the memory cells coupled with each of the word lines are erased in order until all memory cells of the sub-tile are erased in one embodiment. The memory cells of a plurality of additional sub-tiles 60 may also be simultaneously erased in a similar fashion to implement the block erase write operation in one embodiment.

Figure 11:
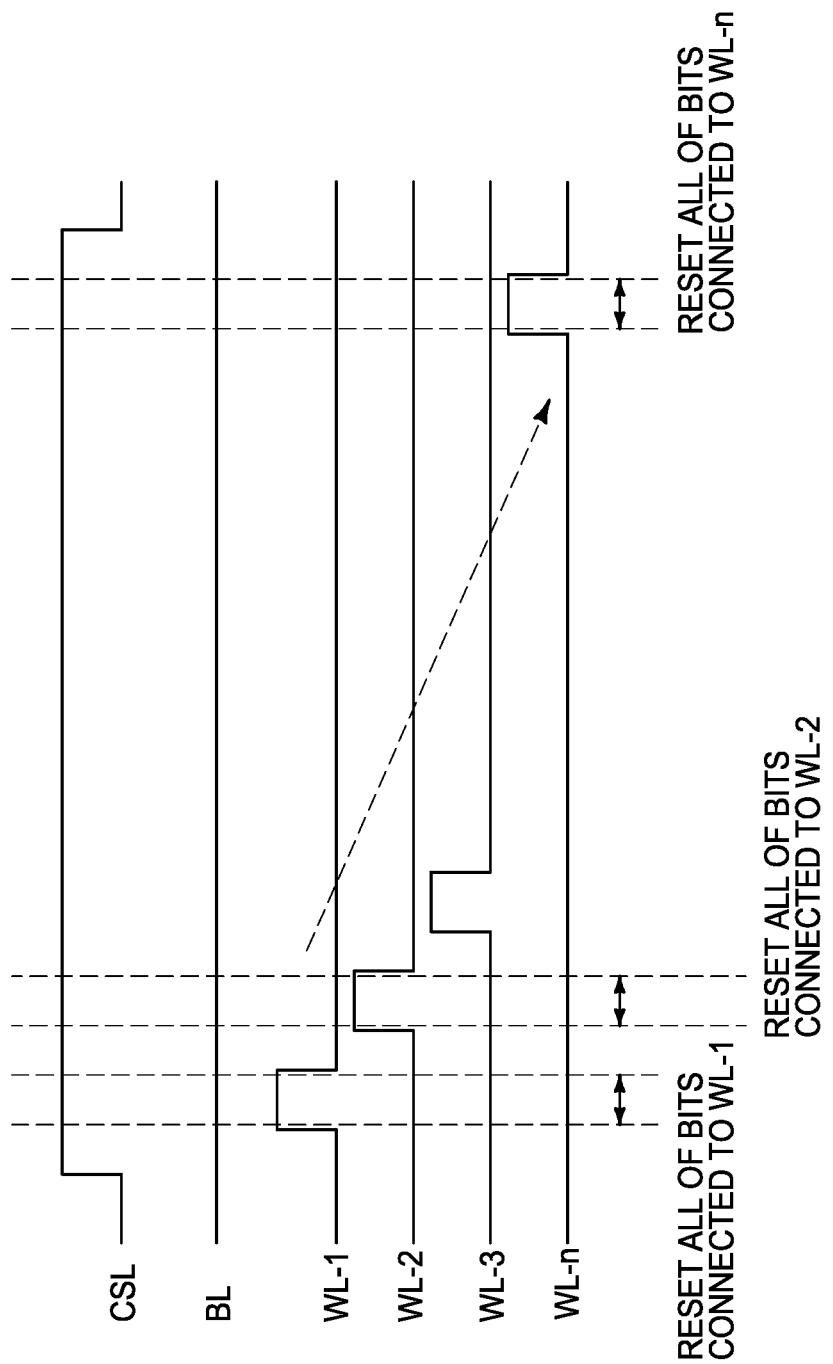
FIG. 11 is a timing diagram of signals used to implement a block erase write operation according to one embodiment.

Referring to FIG. 11, voltage biases of a plurality of signals for implementing a block erase write operation with respect to a single sub-tile 60 according to another embodiment are shown. In this illustrated example, the bit lines coupled with the memory cells of the sub-tile are held at a low voltage potential during the block erase write operation. Similar to the above method, a high voltage bias is applied to the common conductor (e.g., CSL) while individual word lines receive a high voltage bias in order from WL-1 to WL-n. All of the memory cells coupled with word line WL-1 are erased/set during a low voltage bias upon the bit lines of the memory cells while the respective word line WL-1 is held at a high voltage bias. The remaining word lines receive the high voltage bias in order and the memory cells coupled with each of the word lines are erased in order until all memory cells of the sub-tile are erased. The memory cells of a plurality of additional sub-tiles 60 may also be simultaneously erased in a similar fashion to implement the block erase write operation in one embodiment. Other block erase methods are possible in other embodiments.

Referring to FIGS. 12-16, a plurality of sequential processing steps of a semiconductor substrate to form one or more memory chips are discussed according to one possible fabrication embodiment. Other fabrication processes may be used in other embodiments.

Figure 12:
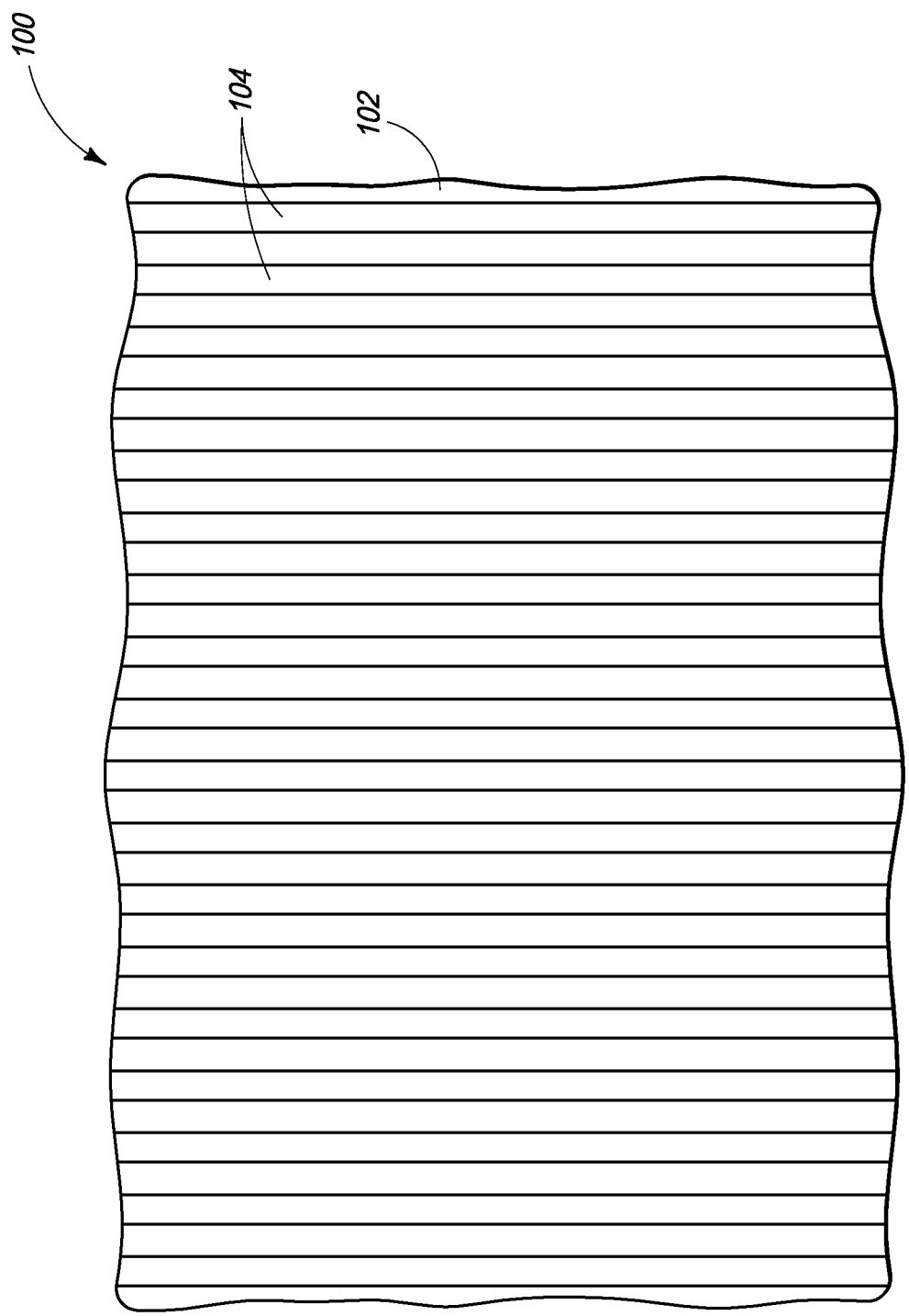
FIGS. 12-16 are illustrative representations of a fragment of a semiconductor substrate being processed during different steps according to one embodiment.

Referring to FIG. 12, a fragment 100 of a semiconductive substrate 102, such as a silicon wafer, is shown at one of the processing steps. The illustrated fragment 100 is a portion of a sub-tile discussed above according to one embodiment. The substrate 102 includes a plurality of active regions 104 in the illustrated step. The active regions 104 may correspond to active regions of NMOS access transistors 32 discussed above and may be formed by implanting an appropriate dopant into the substrate 102 in one embodiment.

Figure 13:
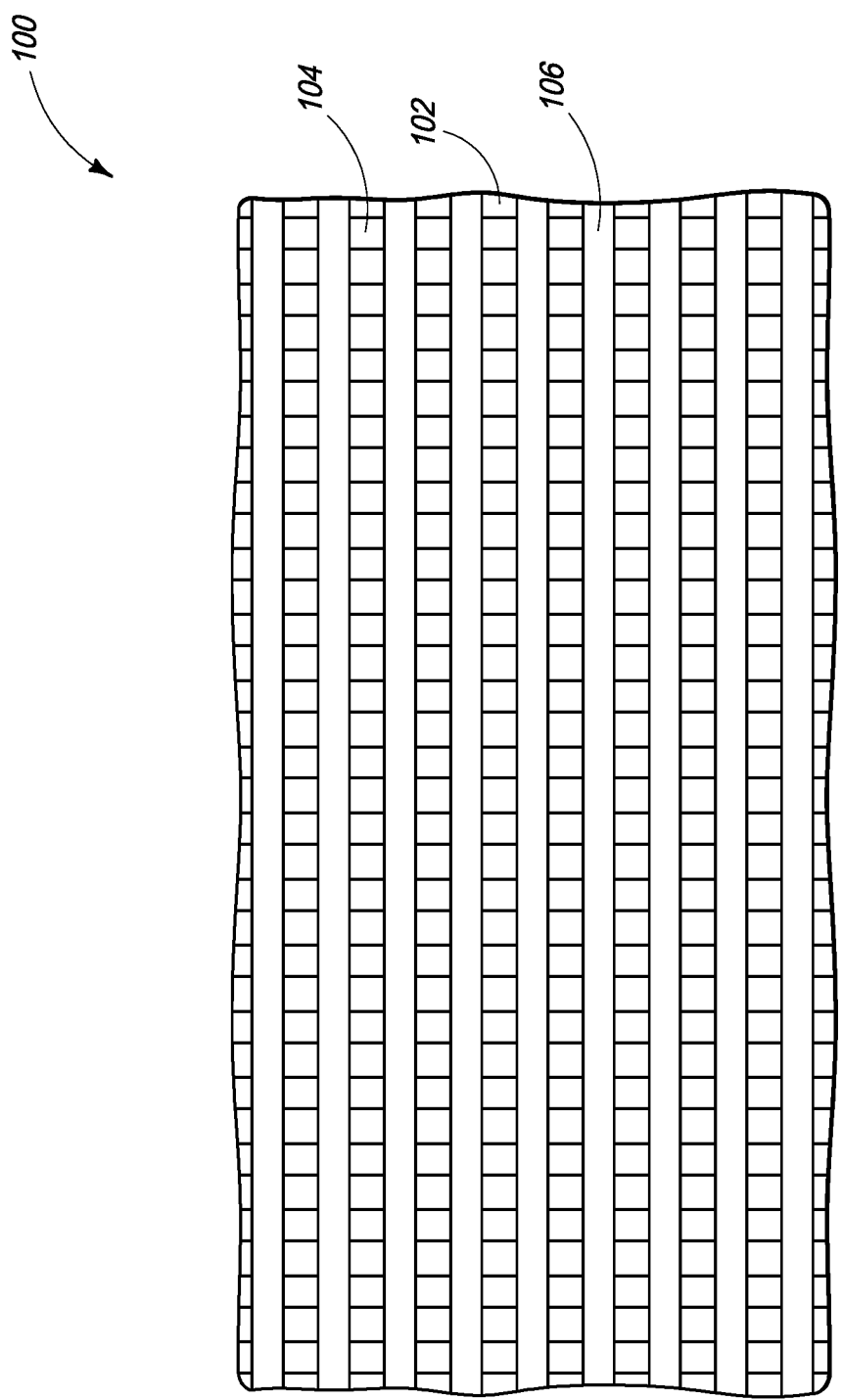

Referring to FIG. 13, a plurality of word lines 106 have been formed over the active regions 104. The word lines 106 may be M0 metallization formed by deposition and patterning of an appropriate metal in one embodiment. The word lines 106 correspond to word lines 34 discussed above and are substantially orthogonal to the active regions 104 in the illustrated embodiment.

Figure 14:
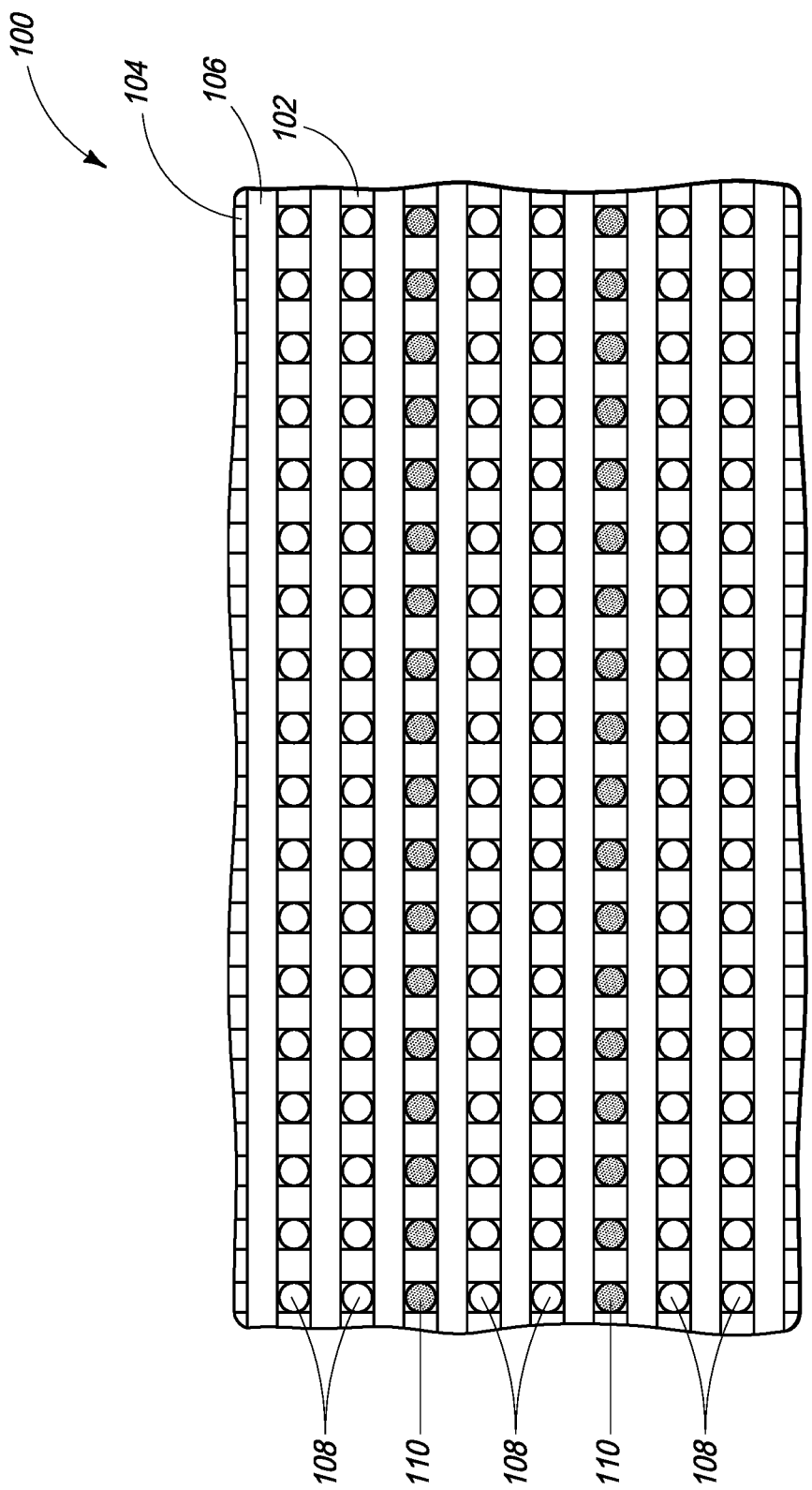

Referring to FIG. 14, a plurality of node contacts 108, 110 are shown arranged in a plurality of rows over the active regions 104. Node contacts 108 are storage node contacts which are connected with the memory elements of the memory cells (the memory elements are not shown) and node contacts 110 are bit node contacts which are connected with subsequently formed bit lines.

Figure 15:
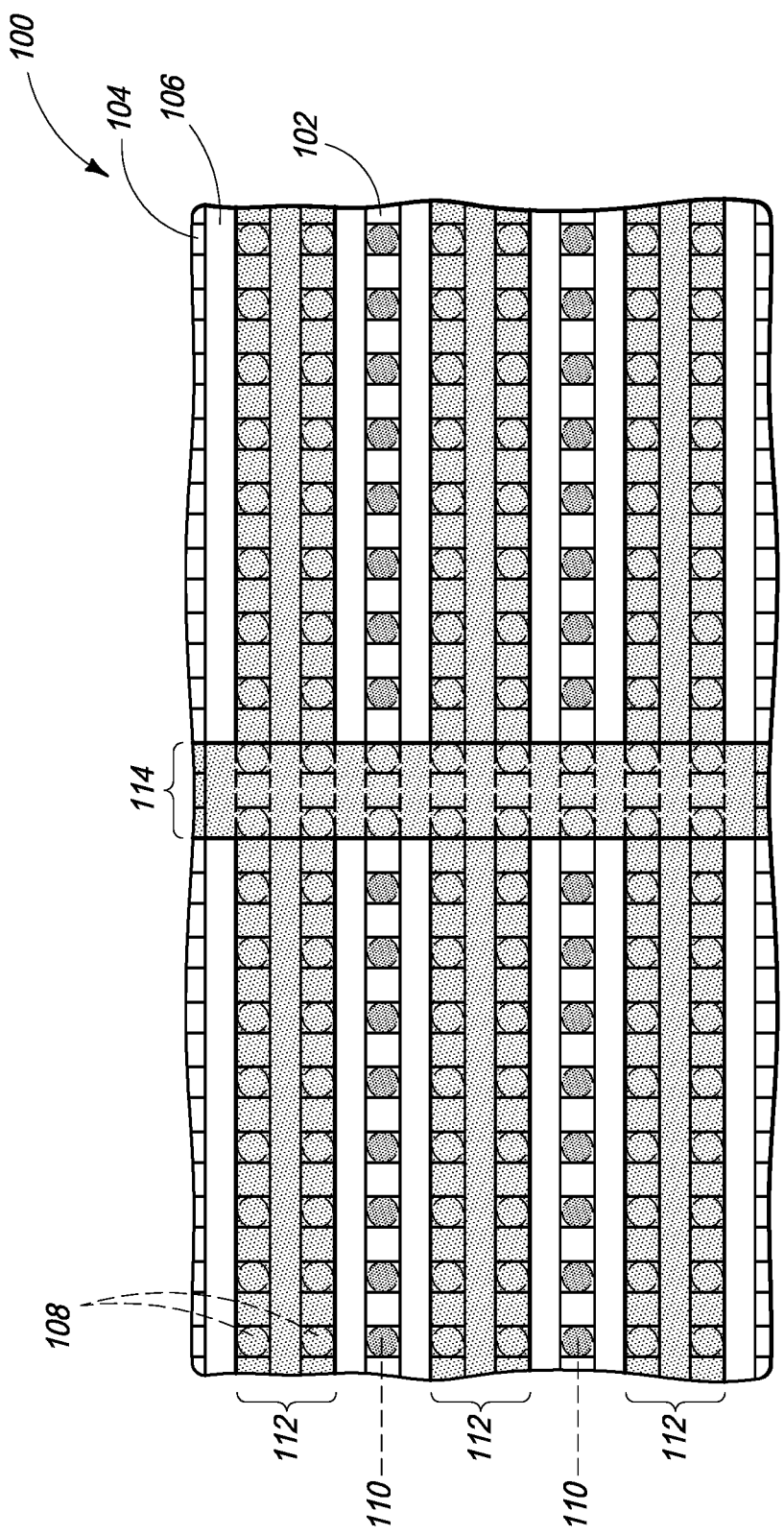

Referring to FIG. 15, a plurality of common source lines (CSLs) 112 are shown over the rows of node contacts 108. The common source lines 112 may be M1 metallization formed by deposition and patterning of an appropriate metal in one embodiment. A CSL strap 114 is shown over the common source lines 112 and may be M2 metallization formed by deposition and patterning of an appropriate metal in one embodiment. CSL strap 114 is electrically connected with the common source lines 112 to form the common conductor or plate discussed above. CSL straps 114 may be provided every sixty-four bits (or active regions) in one embodiment.

Figure 16:
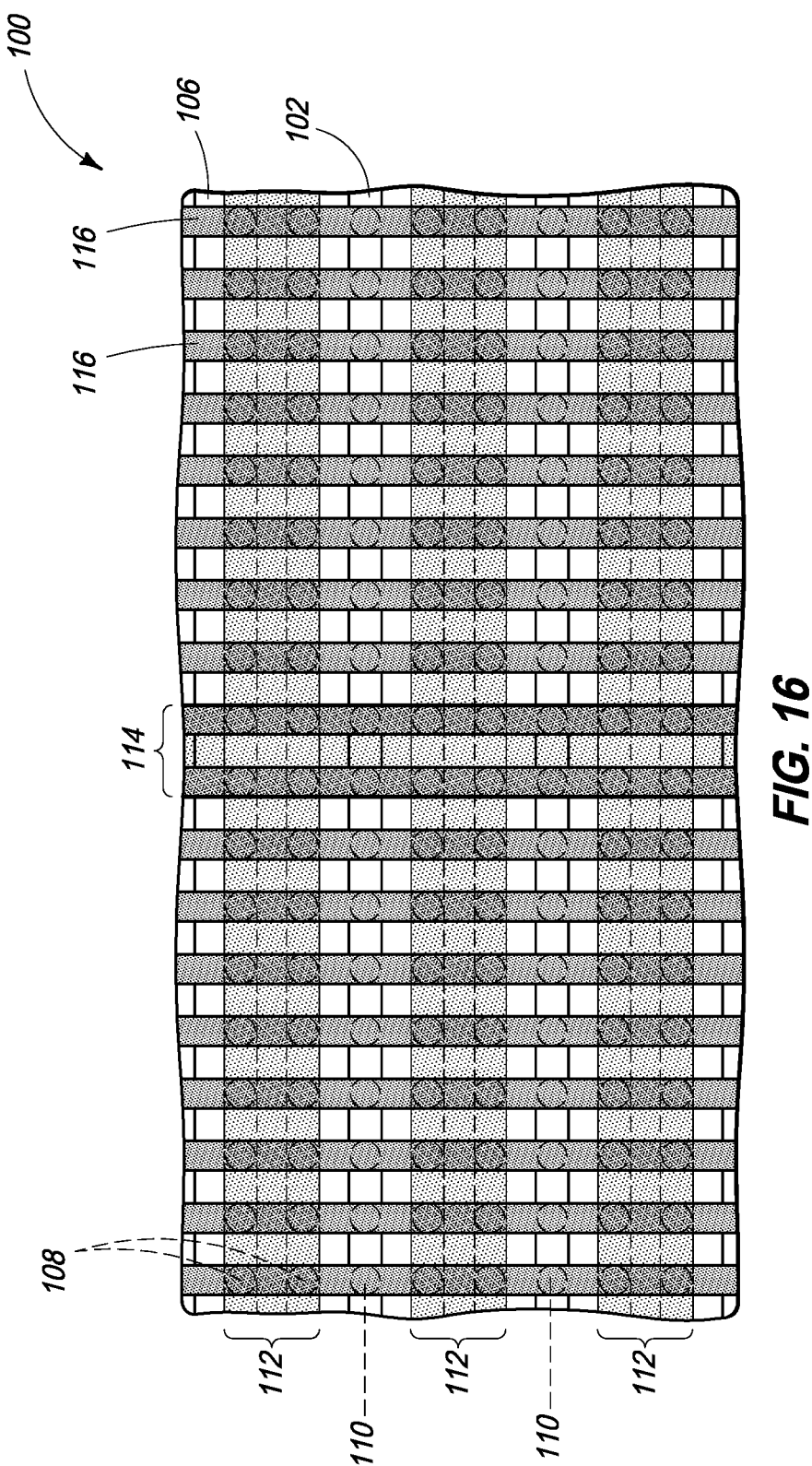

Referring to FIG. 16, a plurality of bit lines are shown 116 which may correspond to bit lines 36 discussed above. Bit lines 116 may be M3 metallization formed by deposition and patterning of an appropriate metal in one embodiment.

The above-described memory arrangements and methods consume less power during write operations compared with some other memory arrangements and methods. As mentioned above, the charging/discharging of the common conductor of a sub-tile consumes a relatively significant amount of power during an erase operation. In some embodiments of the disclosure, a block erase write operation is provided where an increased number of memory cells are erased in a single operation compared with embodiments which erase a page of memory cells in a single operation. The disclosed arrangements and methods implementing block erase write operations utilize approximately one half power and double the erase throughput compared with arrangements which erase plural pages of memory cells in separate operations.

In some embodiments, a memory device comprises a plurality of conductive bridge memory cells arranged in an array, the array comprising X banks each comprising Y tiles each comprising Z sub-tiles, wherein each of the Z sub-tiles comprises N of the conductive bridge memory cells; Z common conductors each associated with one of the Z sub-tiles and the N conductive bridge memory cells of the one of the Z sub-tiles; circuitry located at least partially with the array to write and read a memory state of the conductive bridge memory cells located in a page of memory cells which are located across a plurality of the Z sub-tiles, wherein the page of memory cells comprises less than N conductive bridge memory cells; and wherein the circuitry is configured to erase N conductive bridge memory cells which are associated with one of the Z common conductors in a single erase operation.

In some embodiments, a memory device comprises a plurality of conductive bridge memory cells arranged in an array, the array comprising X banks each comprising Y tiles each comprising Z sub-tiles, wherein each of the Z sub-tiles comprises N of the conductive bridge memory cells, wherein the conductive bridge memory cells individually have different electrical resistances in different ones of a plurality of memory states; Z common conductors each associated with one of the Z sub-tiles and the N conductive bridge memory cells of the one of the Z sub-tiles; a plurality of access circuits located at least partially with the array and individually configured to write and read the memory states of the conductive bridge memory cells located in different respective ones of the Y tiles; wherein the access circuits write and read a page of memory cells which are located across a plurality of the Z sub-tiles, wherein the page of memory cells comprises less than N conductive bridge memory cells, and wherein the access circuits simultaneously write and read the conductive bride memory cells in different ones of the Y tiles to write and read the page of memory cells; wherein the access circuits simultaneously erase the N conductive bridge memory cells of a plurality of the Z common conductors in a single erase operation; and wherein one of the access circuits erases different ones of the N conductive bridge memory cells which are associated with one of the Z common conductors at a plurality of different moments in time between first and second moments in time and the one access circuit maintains the one of the Z common conductors at a voltage potential utilized for an erase operation between the first and second moments in time.

In some embodiments, a method of operating a memory comprising an array of a plurality of conductive bridge memory cells is described. The array further comprising X banks each comprising Y tiles each comprising Z sub-tiles, wherein each of the Z sub-tiles comprises a common conductor associated with N of the conductive bridge memory cells. The method comprising reading and writing a memory state of the conductive bridge memory cells located in a page of memory cells which are located across a plurality of the Z sub-tiles, wherein the page of memory cells comprises less than N conductive bridge memory cells; and erasing N conductive bridge memory cells of one of the Z sub-tiles in a single erase operation.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A memory system comprising:
   a plurality of tiles individually comprising a plurality of sub-tiles, wherein the sub-tiles individually comprise a plurality of memory cells;
   a plurality of access circuits coupled with respective ones of the tiles and wherein the access circuits are individually configured to provide the memory cells of the respective tiles in different memory states;
   wherein one of the access circuits provides the memory cells of one of the sub-tiles of one of the tiles in one of the memory states during a common write operation; and
   wherein another of the access circuits provides the memory cells of another of the sub-tiles of another of the tiles in the one memory state simultaneously with the provision of the memory cells of the one sub-tile in the one memory state during the common write operation.

2. The memory system of claim 1 wherein the sub-tiles individually comprise a common conductor coupled with all of the memory cells of the individual sub-tile.

3. The memory system of claim 1 wherein the common write operation is a block erase write operation.

4. The memory system of claim 1 wherein an individual one of the access circuits is coupled with a plurality of the tiles.

5. A memory writing method comprising:
   simultaneously writing a plurality of memory cells of a plurality of sub-tiles to one of a plurality of different memory states, wherein the sub-tiles individually have a common conductor which is coupled with the memory cells of the individual sub-tile and the writing of the memory cells of an individual one of the sub-tiles comprises:
      providing the common conductor of the individual sub-tile at a first voltage potential which corresponds to the one memory state; and
      applying a second voltage potential which corresponds to the one memory state to different ones of the memory cells of the individual sub-tile at a plurality of different moments in time during the providing the common conductor of the individual sub-tile at the first voltage potential.

6. The method of claim 5 wherein the simultaneously writing comprises simultaneously writing all of the memory cells of the sub-tiles to the one memory state.

7. The method of claim 5 wherein the providing the common conductor of the individual sub-tile at the first voltage potential comprises continuously providing the common conductor at the first voltage potential during the applying the second voltage potential to the different memory cells at the different moments in time.

8. The method of claim 5 wherein the memory cells comprise memory elements which have different electrical resistances which correspond to the different memory states of the memory cells, and wherein the first voltage potential and second voltage potential are provided across the memory elements of the memory cells to write the memory cells.

9. The method of claim 5 wherein the applying comprises applying the second voltage potential to the memory cells which are coupled with one word line at one moment in time and applying the second voltage potential to the memory cells which are coupled with another word line at another moment in time.

10. The memory system of claim 1 wherein the one and the another of the access circuits provide all of the memory cells of the one and the another of the sub-tiles in the one memory state during the common write operation.

11. The memory system of claim 2 wherein the one and the another of the access circuits provide substantially constant voltage biases to the common conductors of the one and the another of the sub-tiles during the common write operation.

12. A memory system comprising:
a chip comprising a plurality of banks;
wherein the banks individually comprise a plurality of tiles;
wherein the tiles individually comprise a plurality of sub-tiles;
wherein the sub-tiles individually comprise a plurality of memory cells and a common conductor which is coupled with the memory cells of the individual sub-tile; and
access circuitry configured to simultaneously provide the memory cells of different ones of the sub-tiles of different ones of the tiles into one of a plurality of different memory states.

13. The memory system of claim 12 wherein the access circuitry comprises a plurality of circuits which are individually configured to simultaneously provide the memory cells of a respective one of the sub-tiles into the one memory state.

14. The memory system of claim 12 wherein the common conductor of an individual sub-tile is maintained at a voltage potential which corresponds to the one memory state during provision of the memory cells of the individual sub-tile into the one memory state.

15. The memory system of claim 12 further comprising a plurality of common source line drivers individually configured to drive the common conductor of a respective one of the sub-tiles to a common voltage bias during the provision of the memory cells of the one sub-tile into the one memory state.

* * * * *